United States Patent [19]
Nakanishi et al.

[11] Patent Number: 5,402,255
[45] Date of Patent: Mar. 28, 1995

[54] LIQUID CRYSTAL PANEL MODULE AND TAPE CARRIER PACKAGE FOR LIQUID CRYSTAL DRIVER IC

[75] Inventors: Hiroyuki Nakanishi, Tenri; Yasunori Chikawa; Naoyuki Tajima, both of Kita-Katsuragi; Hiroshi Nishioka, Yamato-Koriyama, all of Japan

[73] Assignee: Sharp Kabushiki Kaisha, Osaka, Japan

[21] Appl. No.: 19,907

[22] Filed: Feb. 19, 1993

[30] Foreign Application Priority Data

Apr. 16, 1992 [JP] Japan ................. 4-096522
Jun. 17, 1992 [JP] Japan ................. 4-157944

[51] Int. Cl.⁶ ........................... G02F 1/1343
[52] U.S. Cl. ........................... 359/88; 359/85
[58] Field of Search ........................... 359/88

[56] References Cited

U.S. PATENT DOCUMENTS

| | | | |
|---|---|---|---|
| 5,130,832 | 7/1992 | Kawaguchi et al. | 359/88 |
| 5,130,833 | 7/1992 | Mase | 359/88 |
| 5,189,539 | 2/1993 | Suzuki | 359/88 |
| 5,193,022 | 3/1993 | Hirai | 359/88 |
| 5,212,576 | 5/1993 | Yoshioka | 359/88 |

FOREIGN PATENT DOCUMENTS

| | | |
|---|---|---|
| 0333931 | 9/1989 | European Pat. Off. . |
| 0398628 | 11/1990 | European Pat. Off. . |
| 3731787 | 3/1989 | Germany . |
| 1-237520 | 9/1989 | Japan ................. 359/88 |
| 1-287988 | 11/1989 | Japan . |
| 4-000489 | 1/1992 | Japan . |
| 4043327 | 2/1992 | Japan ................. 359/88 |

OTHER PUBLICATIONS

Patent Abstracts of Japan, vol. 10, No. 99 (E-396) (Apr. 16, 1986), Abstract of JP60-240140 (Nov. 29, 1985).

Primary Examiner—Anita Pellman Gross

[57] ABSTRACT

A liquid crystal panel module includes a liquid crystal panel and a plurality of tape carrier packages arranged along a side of the liquid crystal panel. A semiconductor element is attached to the tape carrier packages for operating the liquid crystal panel. Further, outer leads are disposed in the tape carrier packages on both sides of the semiconductor element and connected to each other between adjacent tape carrier packages. Finally, wires are disposed in the semiconductor element to electrically connect the outer leads, disposed on both sides of the semiconductor element, to each other.

5 Claims, 13 Drawing Sheets

LIQUID CRYSTAL PANEL MODULE AND TAPE CARRIER PACKAGE FOR LIQUID CRYSTAL DRIVER IC

BACKGROUND OF THE INVENTION

1. Field of the Invention

The present invention relates to a liquid crystal panel module in which a semiconductor device packaged in a tape carrier package (TCP) system is mounted onto a liquid crystal panel. The present invention also relates to a tape carrier package for a driver IC in a liquid crystal display unit.

2. Description of the Related Art

In many cases, a liquid crystal driver constructed by an integrated circuit (IC), etc. for operating a liquid crystal panel is generally-mounted onto the liquid crystal panel in the form of a tape carrier package (TCP) as one form of a package of a semiconductor device.

In general, light in weight, thin, short and compact structures, at a low cost, are what is required in a liquid crystal panel module.

However, in the general liquid crystal panel module, it is necessary to dispose a substrate at any time so as to electrically connect semiconductor devices to each other, even when the semiconductor devices of a super slim tape carrier package (SST) type are used. Therefore, cost of the liquid crystal panel module is increased and it is disadvantageous to dispose the substrate when the liquid crystal panel module is made compact. Further, when the substrate and each of the semiconductor devices are electrically connected to each other, it is necessary to position the substrate and the semiconductor devices, thereby further increasing the cost of the liquid crystal panel module.

In a general tape carrier package for a liquid crystal driver IC, it is necessary to dispose printed wired boards on upper and lower sides and a left-hand side of the liquid crystal panel so as to commonly connect plural driver integrated circuits. Therefore, a size of the liquid crystal panel is inevitably increased. The increase in panel size is a decisive negative factor in a compact device such as a personal computer of a notebook type, for example. Further, since costs for material, design and development of the printed wired boards are separately required, cost of the liquid crystal panel module is increased.

SUMMARY OF THE INVENTION

It is therefore a first object of the present invention to provide a compact liquid crystal panel module which can be produced at a reduced cost.

A second object of the present invention is to provide a tape carrier package for a liquid crystal driver integrated circuit in which a liquid crystal module using this tape carrier package is made compact and light in weight, wherein cost of the liquid crystal module is reduced.

The above first object of the present invention can be achieved by a liquid crystal panel module comprising a liquid crystal panel; a plurality of tape carrier packages arranged along a side of the liquid crystal panel; a semiconductor element attached to the tape carrier packages for operating the liquid crystal panel; outer leads disposed in the tape carrier packages on both sides of the semiconductor element and connected to each other between adjacent tape carrier packages; and wires disposed in the semiconductor element to electrically connect the outer leads disposed on both sides of the semiconductor element to each other.

In accordance with the liquid crystal panel module of the present invention, the outer leads are disposed in the tape carrier package (TCP) on both sides of the semiconductor element. Such outer leads are electrically connected to each other between adjacent tape carrier packages. The semiconductor element has wires for electrically connecting the outer leads disposed on both sides of the semiconductor element to each other. Accordingly, signals can be transmitted and received (or exchanged) through the outer leads and these wires, between semiconductor elements attached onto the respective tape carrier packages. Further, an electric current can flow through these semiconductor elements through the outer leads and these wires. Therefore, in the liquid crystal panel module of the present invention, it is not necessary to dispose a substrate for connecting semiconductor devices to each other in the general liquid crystal panel module. Accordingly, it is possible to make the liquid crystal panel module compact and reduce cost of the liquid crystal panel module. Further, it is not necessary to position such a substrate and the semiconductor devices. Thus, the cost of the liquid crystal panel module can be further reduced.

The above second object of the present invention can be achieved by a tape carrier package for a liquid crystal driver integrated circuit comprising external connecting terminals for input and output signals disposed at left-hand and right-hand ends of the tape carrier package; and a pair of connecting pads corresponding to the external connecting terminals and disposed in a central portion of the tape carrier package; the pair of connecting pads being connected to each other through an internal circuit of the liquid crystal driver integrated circuit.

Two external connecting terminals for input and output signals are disposed at left-hand and right-hand ends of the tape carrier package. The input and output signals are symmetrically provided. The external connecting terminals for the same signals are connected to each other through conductive materials. One of these external connecting terminals has a slit portion partially removing a TCP material therefrom. When this tape carrier package is used for a liquid crystal module, the external connecting terminals for input and output signals of first and second tape carrier packages can be electrically connected to each other between continuous adjacent tape carrier packages without using any connecting line, substrate, etc.

Accordingly, a liquid crystal module using this tape carrier package can be made compact and light in weight and cost of the liquid crystal module can be reduced.

Further objects and advantages of the present invention will be apparent from the following description of the preferred embodiments of the present invention as illustrated in the accompanying drawings. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

The preferred embodiments of a liquid crystal panel module and a tape carrier package for a liquid crystal driver IC in the present invention will next be described in detail with reference to the accompanying drawings.

Figure 1:
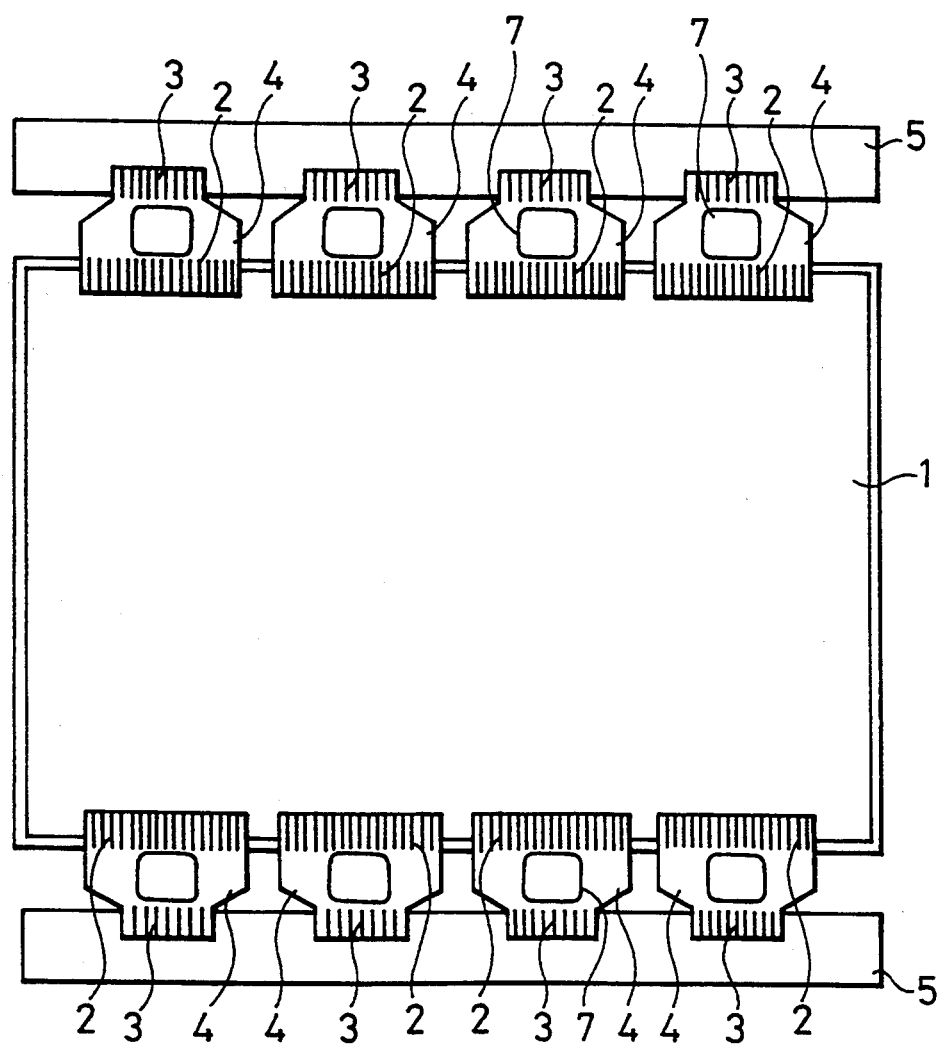
FIG. 1 is a plan view showing one example of a general liquid crystal panel module.

FIG. 1 shows one example of a liquid crystal panel module onto which a semiconductor device is mounted.

In FIG. 1, a plurality of semiconductor devices 4 of a tape carrier package (TCP) type are mounted onto a liquid crystal panel 1. Each of the semiconductor devices 4 has a semiconductor chip 7, an outer lead 2 on the side of an output terminal, and an outer lead 3 on the side of an input terminal. Each of the semiconductor devices 4 is connected to the liquid crystal panel 1 through the outer lead 2 and is connected to a substrate 5 through the outer lead 3. Each of the semiconductor devices 4 can transmit and receive signals through wirings on this substrate 5. Further, an electric current can flow through each of the semiconductor devices 4 through these wirings on this substrate 5.

Figure 2:
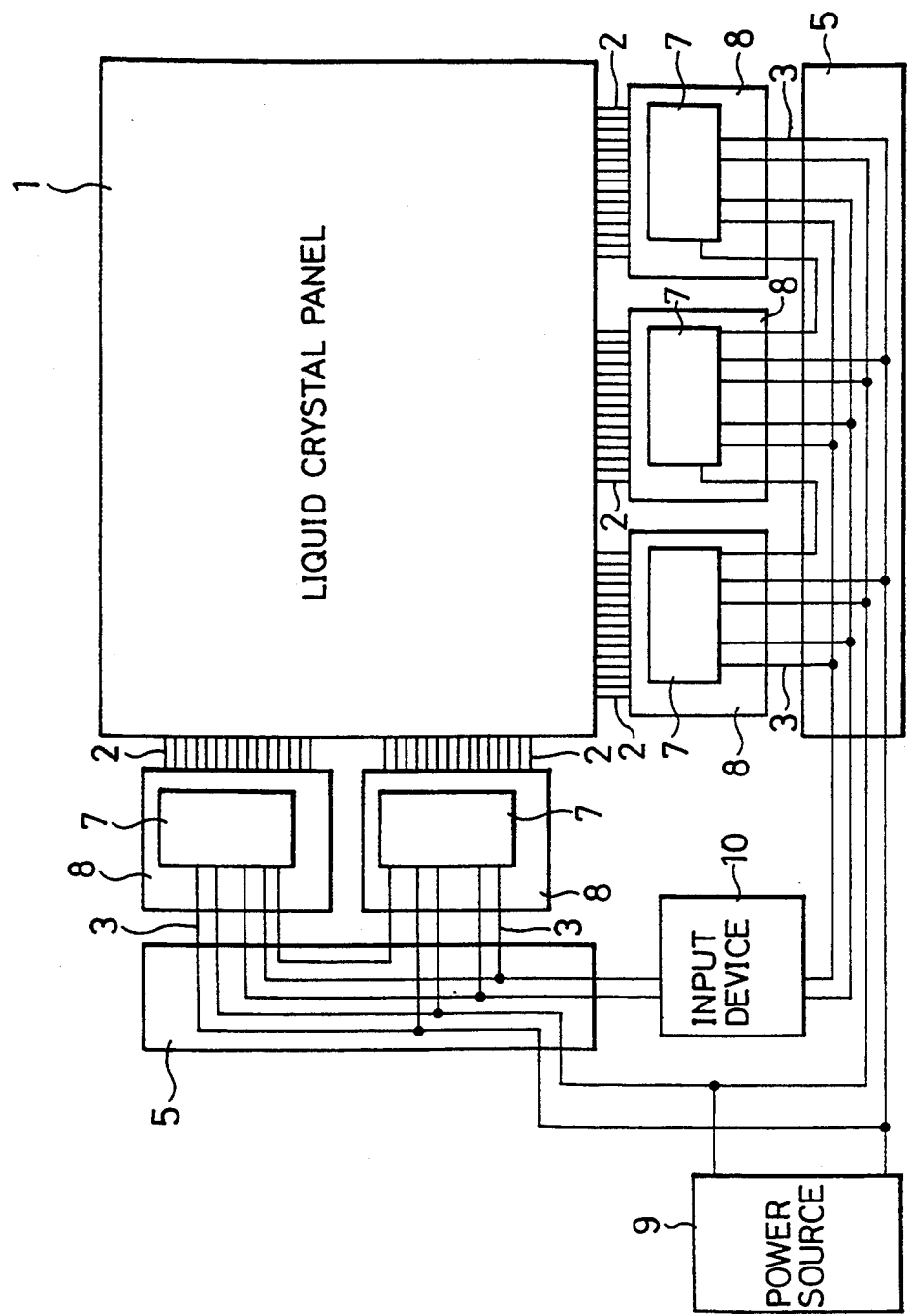
FIG. 2 is a plane view showing another example of a general liquid crystal panel module.

FIG. 2 shows another example of a liquid crystal panel module provided with a semiconductor chip.

In FIG. 2, a plurality of semiconductor chips 7 are mounted onto a TCP 8. Each of semiconductor chips has outer lead 2 on the side of an output terminal and an outer lead 3 on the side of an input terminal. Each one of the semiconductor chips 7 is connected to the liquid crystal panel 1 through the outer lead 2 and is connected to an input device 10 including a controller data clock etc. for data input and a power source through the outer lead 3 disposed on a substrate 5. Each one of the semiconductor chips 7 can transmit and receive signals through the outer leads 2 and 3.

Recently, the compactness of a semiconductor device mounted onto the liquid crystal panel has become indespensable to the requirements for lightness in weight, thin, short and compact structures in the markets. An elongated semiconductor device 40 of the TCP type shown in FIG. 2 is used to satisfy these requirements and is called a super slim tape carrier package (SST).

Figure 3:
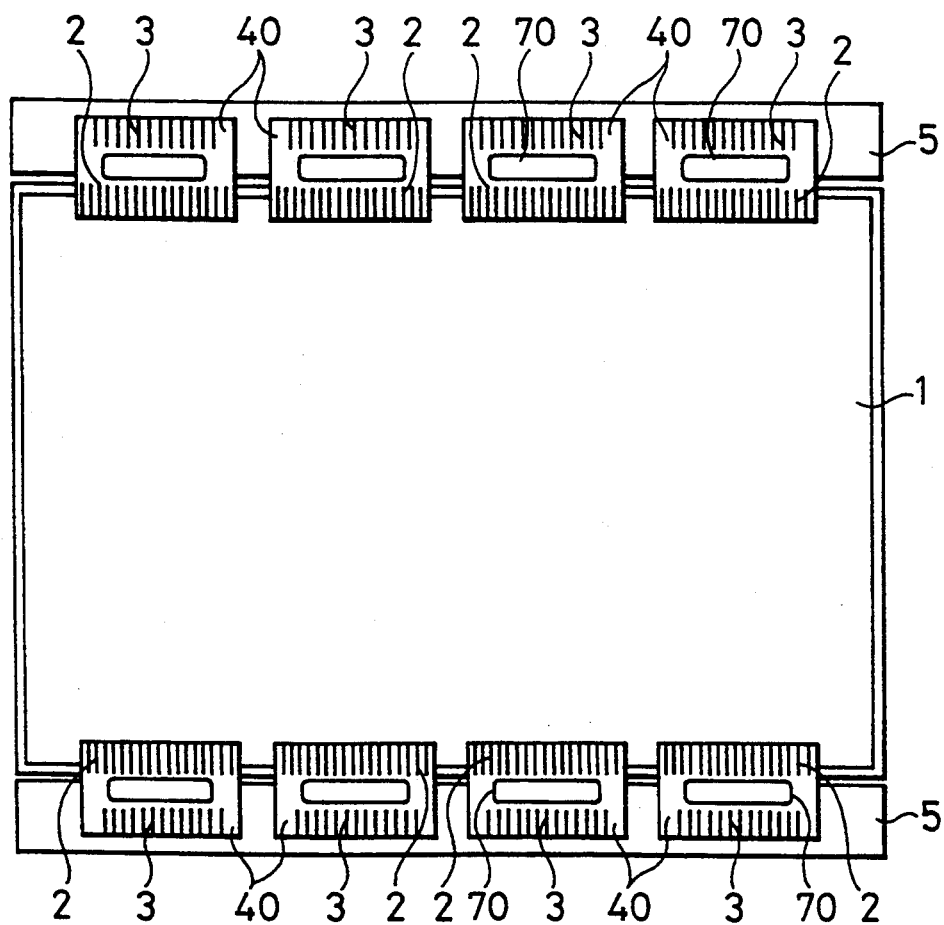
FIG. 3 is a plan view showing another modified example of the general liquid crystal panel module.

As shown in FIG. 3, the semiconductor device 40 is mounted onto a liquid crystal panel 1 and a semiconductor chip 70 has an elongated shape so that the semiconductor device 40 also has an elongated shape along a side of the liquid crystal panel 1. Accordingly, a longitudinal length of the liquid crystal panel module can be reduced by using such a semiconductor device 40 so that the liquid crystal panel module can be made compact.

Figure 4:
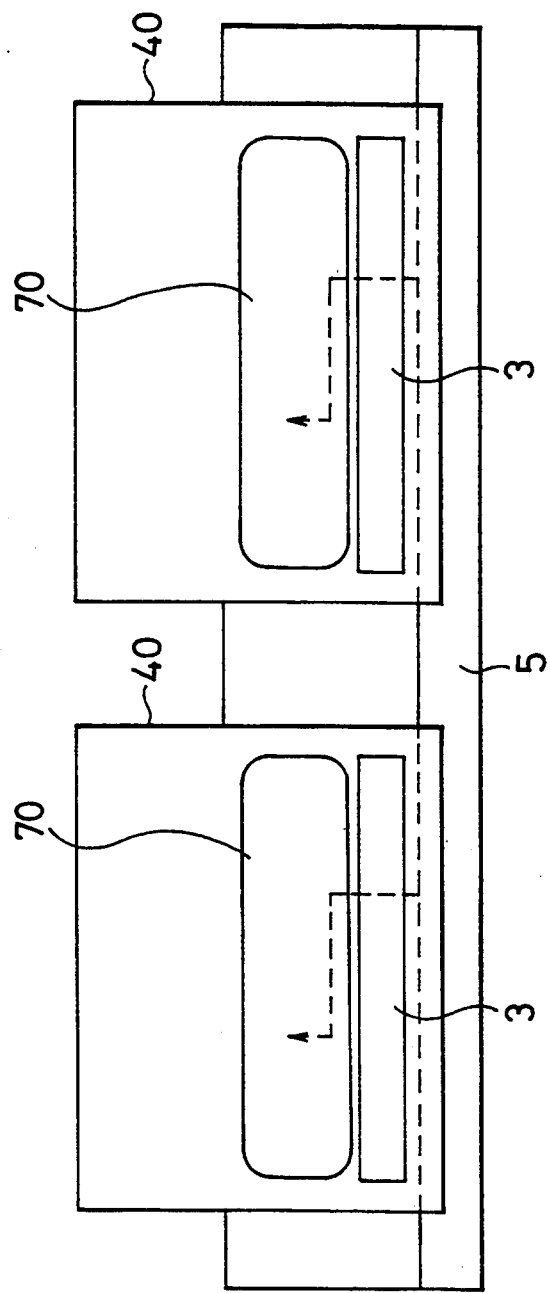
FIG. 4 is a plan view showing flows of signals between semiconductor devices mounted onto the liquid crystal panel module shown in FIG. 3.

In FIG. 4, paths of signal transmission and reception (or exchange) and electric current flow in the semiconductor device 40 shown in FIG. 3 are shown by dotted lines. As shown in FIG. 3, semiconductor devices 40 are electrically connected to each other through a substrate 5 so that it is possible to provide electric connections required to operate the compact liquid crystal panel module.

In general, a light in weight, thin, short and compact structure which is low cost is required in the liquid crystal panel module of this kind.

However, in the above-mentioned general liquid crystal panel module, it is necessary to dispose the substrate 5 at any time so as to electrically connect the semiconductor devices 40 to each other even when the semiconductor devices 40 of an SST type are used. Therefore, cost of the liquid crystal panel module is increased and it is disadvantageous to dispose the substrate 5 when the liquid crystal panel module is made compact. Further, when the substrate 5 and each of the semiconductor devices 40 are electrically connected to each other, it is necessary to position the substrate 5 and the semiconductor devices 40, thereby further increasing the cost of the liquid crystal panel module.

Figure 5:
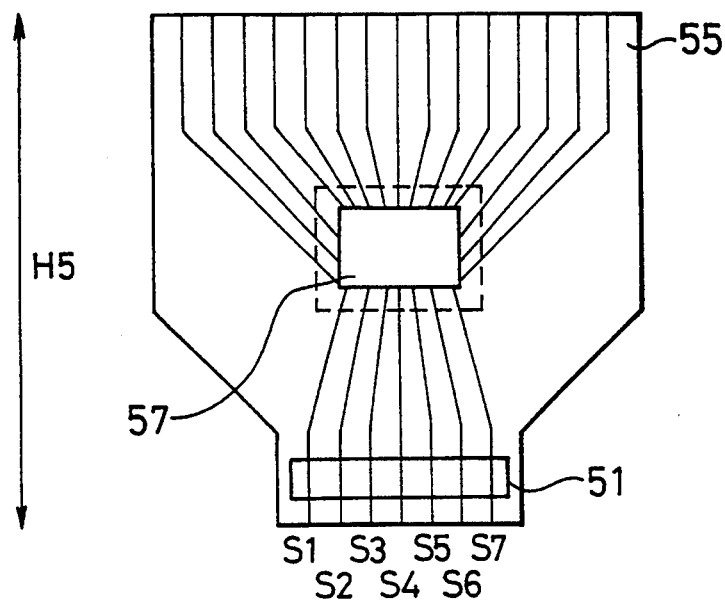
FIG. 5 is a view showing the construction of a general tape carrier package for a liquid crystal driver integrated circuit.
Figure 6:
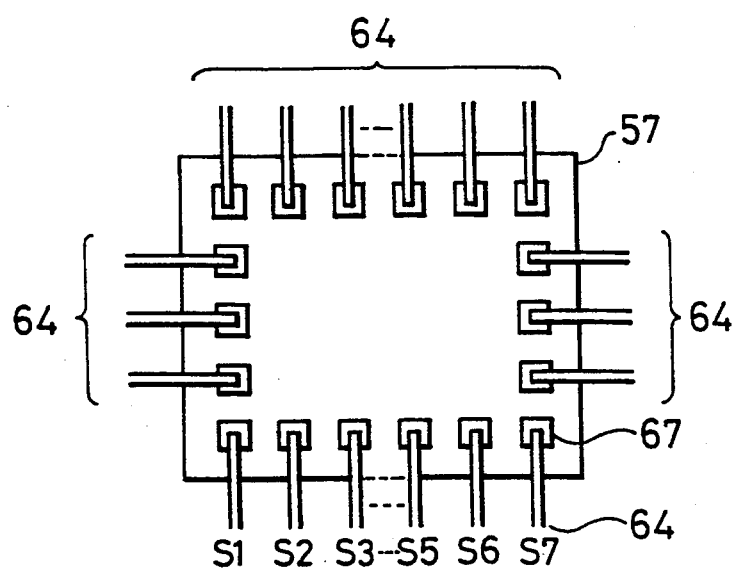
FIG. 6 is an enlarged view of a connecting portion between a chip and the general tape carrier package for a liquid crystal driver integrated circuit.
Figure 7:
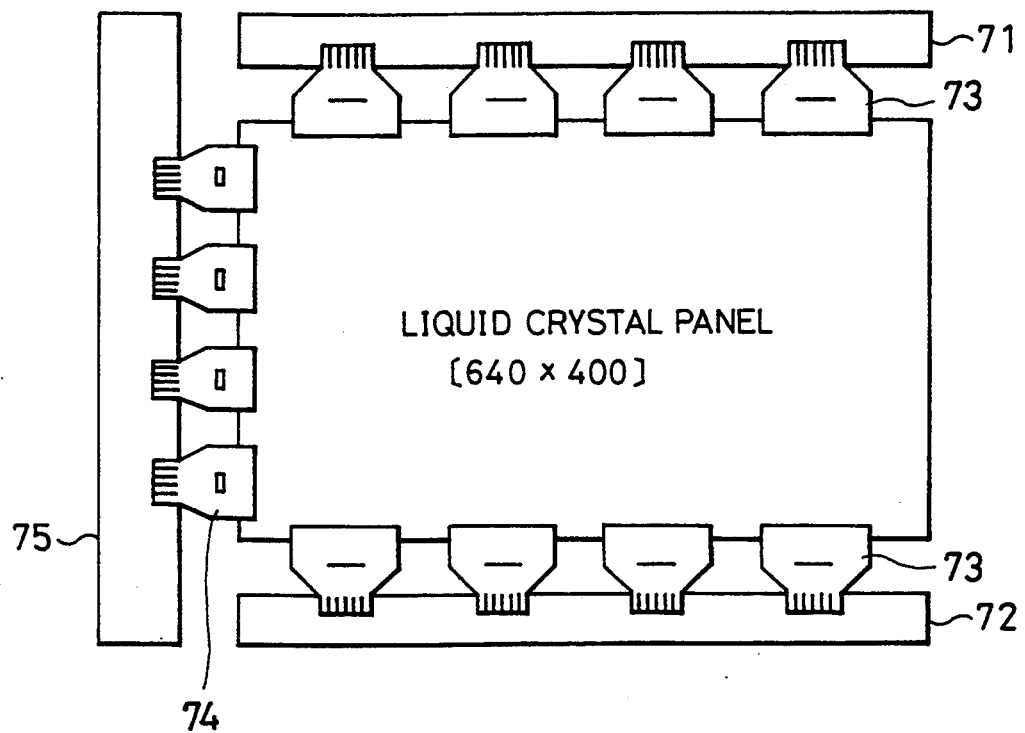
FIG. 7 is a view showing one example of the construction of a liquid crystal module using the general tape carrier package for a liquid crystal driver integrated circuit.

FIGS. 5, 6 and 7 show the connecting relation of input and output signals between driver integrated circuits (ICs) in a general liquid crystal display unit. For example, the driver integrated circuits 73 and 74 in FIG. 7 are electrically connected to each other through a printed wired board as a substrate as shown in FIG. 7. FIG. 5 shows the shape of a tape carrier package in a general driver integrated circuit. An external connecting terminal portion 51 for input and output signals is commonly disposed with respect to a plurality of driver integrated circuits. This external connecting terminal portion 51 is arranged on a lower side of the tape carrier package. Namely, the external connecting terminal portion 51 is arranged on a side of the tape carrier package opposite to an external connecting terminal portion 55 for a liquid crystal driving output. This external connecting terminal portion 51 is connected to lead terminals for connections of printed wired boards 71, 72 and 75 by soldering such that input and output signals are transmitted and received between the driver integrated circuits. For example, a longitudinal length H5 of a general printed wired board is set to be equal to or greater than 15 mm.

A driver chip 57 is approximately arranged in a central portion of the tape carrier package. The driver chip 57 has the external connecting terminal portion 55 for a liquid crystal driving output on an upper side thereof. The driver chip 55 has the external connecting terminal portion 51 for input and output signals (common to the plural driver integrated circuits) on a lower side thereof. The driver chip 57 has pullout terminals receiving signals $S_1$ to $S_7$ inputted thereto. A chip portion is covered with resin to protect this chip portion physically and chemically. In general, the external connecting terminal portion 55 for a liquid crystal driving output is directly connected to a liquid crystal panel through an anisotropic conductive sheet. The external connecting terminal portion 51 for input and output signals has a slit removing a TC, P material therefrom. A signal common to the plural driver integrated circuits can be supplied by soldering and connecting the slit to a printed wired board.

FIG. 6 is an enlarged view of a connecting portion of the driver chip 57 and the tape carrier package. An inner lead 64 disposed in a central portion of the tape carrier package is thermally press-fitted into a pad 67 disposed on this chip 57 so that the inner lead 64 and the pad 67 are electrically and physically connected to each other. In this case, each of terminals $S_1$ to $S_7$ of the external connecting terminal portion 51 for input and output signals is disposed every one electric signal. Accordingly, one pad is disposed every one electric signal.

FIG. 7 shows the shape of a general liquid crystal panel module. For example, when a liquid crystal panel has 640×400 dots in transversal and longitudinal directions, respectively, the number of liquid crystal driving outputs is set to 160 with respect to each of eight segment drivers arranged on upper and lower sides of the panel and is set to 100 with respect to each of four common drivers arranged on a left-hand side of the panel.

As can be seen from FIGS. 5, 6 and 7, it is necessary to dispose printed wired boards on the upper and lower sides and the left-hand side of the panel so as to commonly connect the plural driver integrated circuits. Therefore, a size of the liquid crystal panel is inevitably increased. The increase in panel size is a decisive negative factor in a compact device such as a personal computer of a notebook type. Further, since costs for material, design and development of the printed wired boards are separately required, cost of the liquid crystal panel module is increased.

Figure 8:
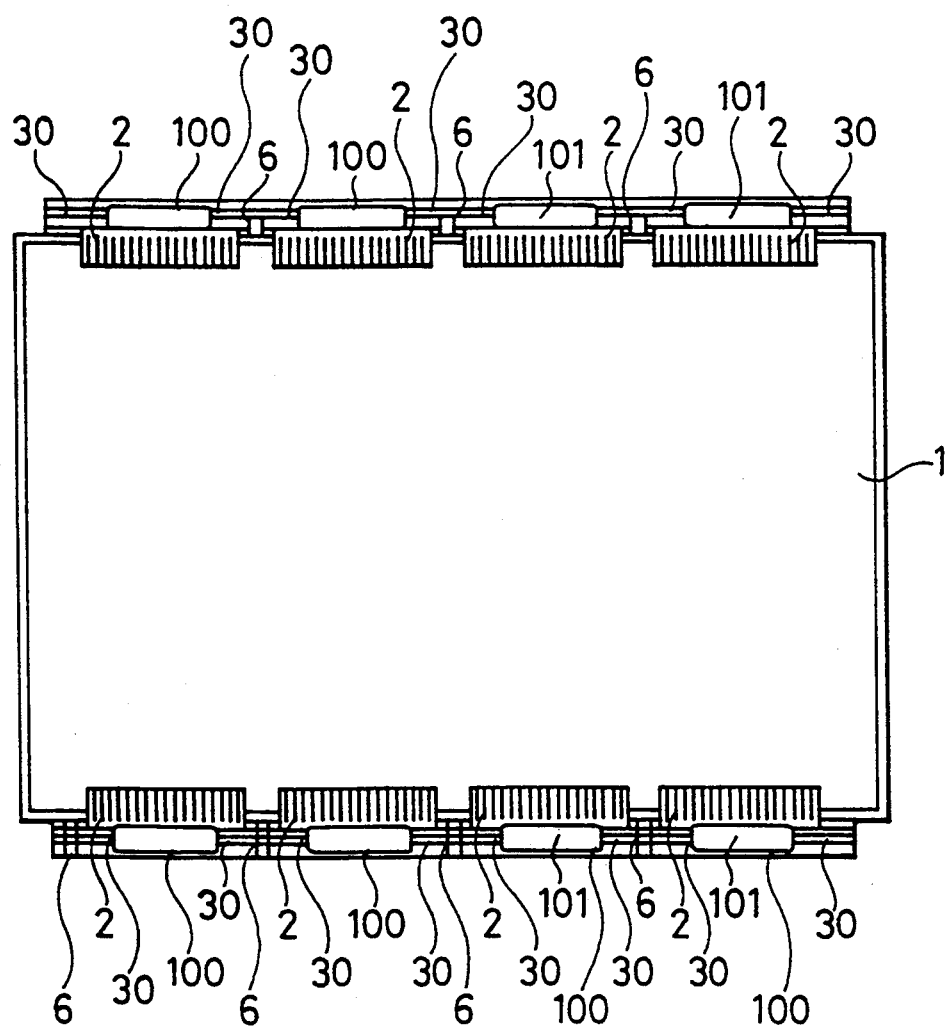
FIG. 8 is a plan view showing a liquid crystal panel module in accordance with a first embodiment of the present invention.

FIG. 8 shows a liquid crystal panel module in accordance with one embodiment of the present invention.

In FIG. 8, the liquid crystal panel module has a liquid crystal panel 1. A plurality of semiconductor devices 100 of a tape carrier package (TCP) system are mounted onto the liquid crystal panel 1 along upper and lower sides thereof. Each of the semiconductor devices 100 includes a semiconductor chip 101 of an integrated circuit (IC) as one of semiconductor elements attached onto a tape of the tape carrier package (TCP). Each of the semiconductor devices 100 also includes an outer lead 2 disposed in the tape carrier package on the side of an output terminal and an outer lead 30 disposed in the tape carrier package on the side of an input terminal.

A slit 6 for connection is disposed on one side of a base tape of the outer lead 30. Adjacent semiconductor devices 100 are connected to each other in a predetermined manner through the outer lead 30 extending in a longitudinal direction of the semiconductor chip 101 on both sides thereof. Wiring for electrically connecting outer leads 30 located on both sides of the semiconductor chip 101 on the same tape to each other is performed with respect to the semiconductor chip 101. The slit 6 may be disposed on both sides of each of the outer leads 30.

Similar to the general liquid crystal panel module, each of the semiconductor devices 100 and the liquid crystal panel 1 are electrically connected to each other through the outer lead 2. As shown in FIG. 8, the adjacent semiconductor devices 100 are electrically connected to each other by directly connecting outer leads 80 of the adjacent semiconductor devices 100 to each other.

Figure 9:
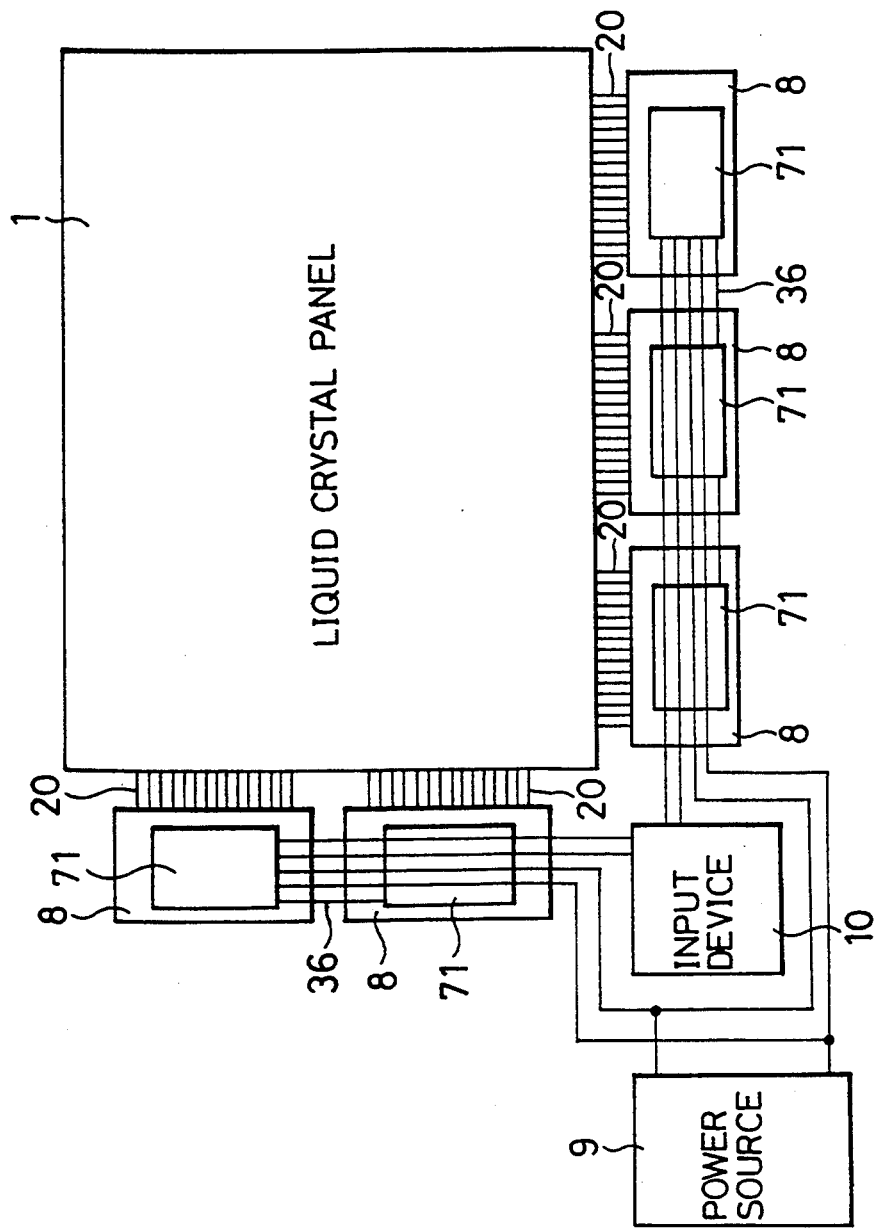
FIG. 9 is a plan view showing a liquid crystal panel module in accordance with a second embodiment of the present invention.

FIG. 9 shows a liquid crystal panel module in accordance with a second embodiment of the present invention.

Figure 10:
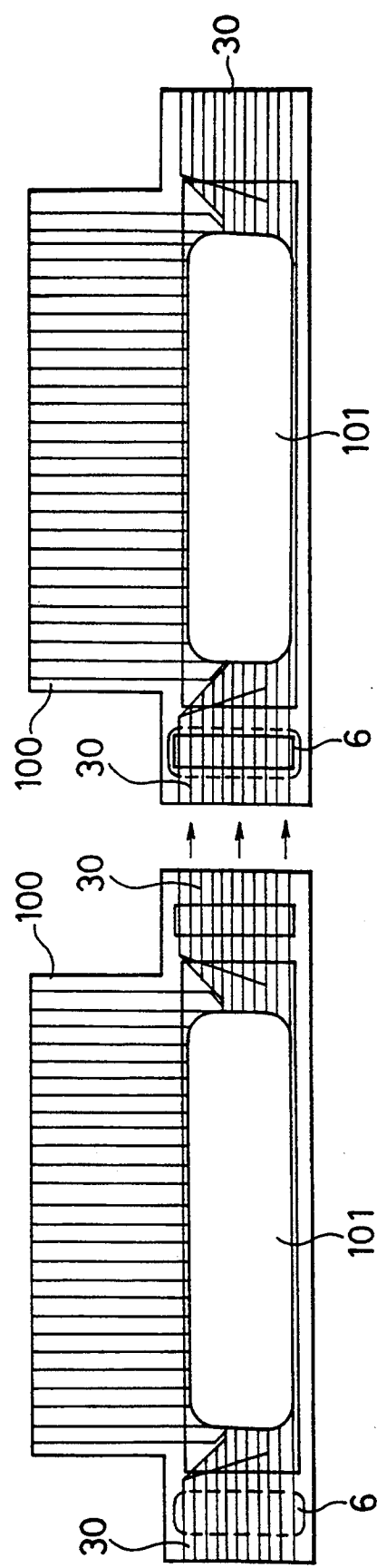
FIG. 10 is a plan view showing the detailed structure of a semiconductor device mounted onto the liquid crystal panel module shown in FIG. 8.

In FIG. 9, the liquid crystal panel module has a liquid crystal panel 1. Each of a plurality of semiconductor chips 71 is mounted onto a TCP 8 and has an outer lead 20 on the side of an output terminal and an outer lead 36 disposed on the TCP 8 on the side of an input terminal. Each of the semiconductor chips 71 is connected to the liquid crystal panel through the outer lead 20 and is connected to an input device 10 including a controller data clock etc. for data input and a power source 9 through the outer lead 86 disposed on the TCP 8. Each of the semiconductor chips 71 can transmit and receive signals through the outer leads 20 and FIG. 10 is an enlarged view of each of two semiconductor devices 100 adjacent and mounted onto a liquid crystal panel and shown in FIG. 8. FIG. 10 shows a state of the semiconductor devices before such outer leads 30 are connected to each other.

Figure 11:
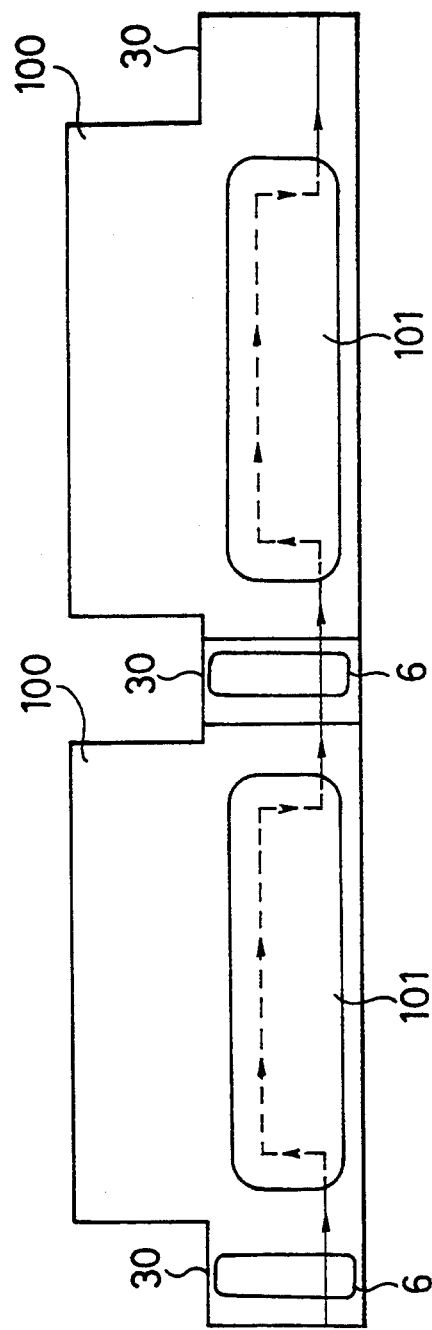
FIG. 11 is a schematic plan view showing flows of signals between semiconductor devices mounted onto the liquid crystal panel module shown in FIG. 8.

As shown by a dotted line in FIG. 11, an electric signal is inputted to one of the mounted semiconductor devices 100 through one outer lead SO and is transmitted to the semiconductor chip 101 through an inner lead of this semiconductor device 100. This signal is outputted to another outer lead 30 through wiring within the semiconductor chip 101 and an inner lead of the semiconductor chip 101 on a side opposite to the above inner lead of the semiconductor device 100. This signal is then inputted to the next semiconductor device 100 from this another outer lead 30. The features of the liquid crystal panel module in this embodiment can be easily understood by comparing FIG. 11 with FIG. 4 showing signal paths in the above general liquid crystal panel module. FIG. 11 schematically shows a state of the liquid crystal panel module in which two semiconductor devices 100 shown in FIG. 8 are connected to each other.

As mentioned above in detail, in accordance with the liquid crystal panel module of the present invention, outer leads are disposed in a tape carrier package (TCP) on both sides of a semiconductor element. These outer leads are electrically connected to each other between adjacent tape carrier packages. Wiring for electrically connecting the outer leads disposed on both sides of the semiconductor element is provided for this semiconductor element. Accordingly, signals can be transmitted and received (or exchanged) through the outer leads and this wiring between semiconductor elements attached onto the respective tape carrier packages. Further, an electric current can flow through these semiconductor elements through the outer leads and this wiring. Therefore, in the liquid crystal panel module of the present invention, it is not necessary to dispose a substrate for connecting semiconductor devices to each other in the general liquid crystal panel module. Accordingly, it is possible to make the liquid crystal panel module compact and reduce cost of the liquid crystal panel module. Further, it is not necessary to position such a substrate and the semiconductor devices so that the cost of the liquid crystal panel module can be further reduced.

As a result, in accordance with the present invention, it is possible to provide a compact liquid crystal panel module with reduced cost.

A tape carrier package for a liquid crystal driver IC in accordance with another embodiment of the present invention will next be described in detail with reference to FIGS. 12 to 15.

Figure 12:
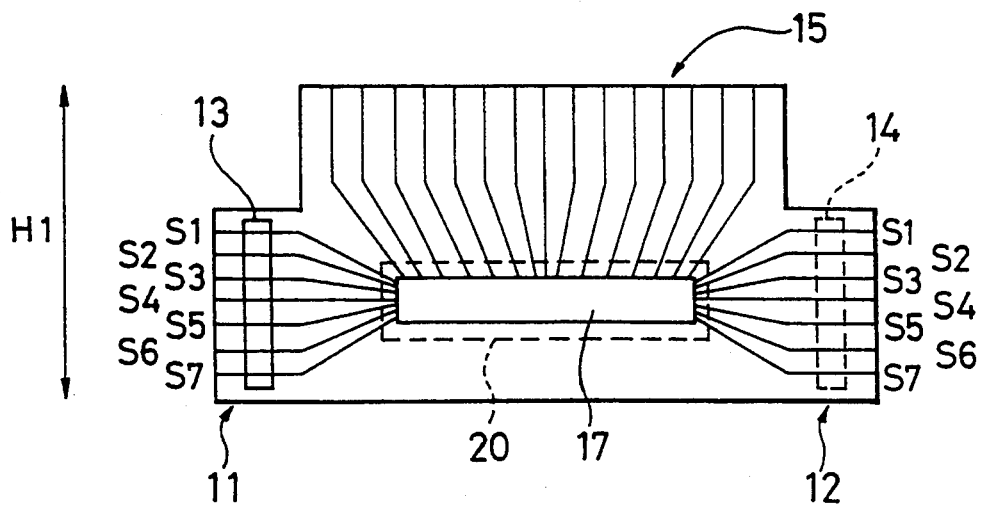
FIG. 12 is a view showing the construction of a tape carrier package for a liquid crystal driver integrated circuit in accordance with a third embodiment of the present invention.

FIG. 12 shows the shape of a tape carrier package for a driver integrated circuit (IC) in a liquid crystal display unit of the present invention. The tape carrier package has external connecting terminal portions 11 and 12 for the same input and output signals $S_1$ to $S_7$ on left-hand and right-hand sides thereof. The tape carrier package also has a slit 18 removing a TCP material therefrom in one of the external connecting terminal portions. In this embodiment, the slit is disposed in the left-hand external connecting terminal portion 11. The tape carrier package further has a lead 14 in the other of the external connecting terminal portions. In this embodiment, the lead 14 is formed in the right-hand external connecting terminal portion 12 and can be electrically connected to this external connecting terminal portion 12 by soldering. Thus, adjacent integrated circuits can be directly connected to each other without using any printed wired board (PWB).

Figure 13:
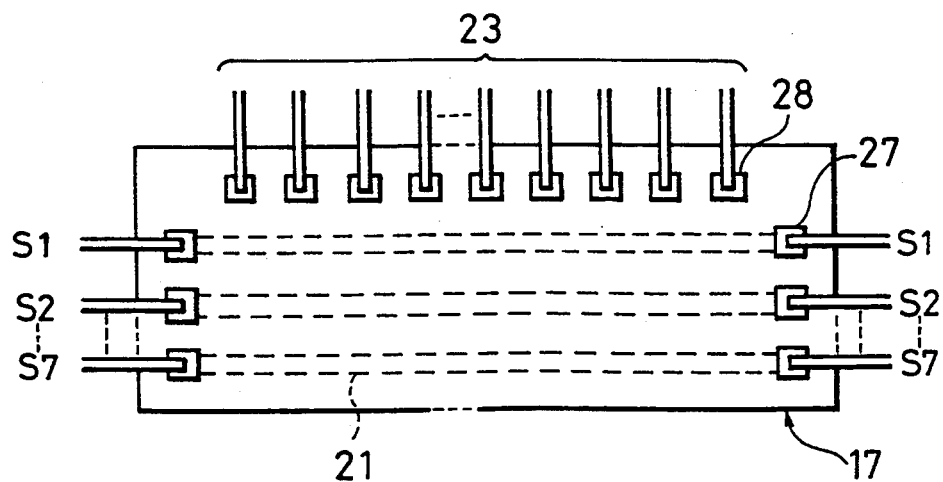
FIG. 13 is an enlarged view of a connecting portion between a chip and the tape carrier package for a liquid crystal driver integrated circuit shown in FIG. 12.

FIG. 13 is an enlarged view of a connecting portion between the tape carrier package and a chip 17 in the driver integrated circuit of the present invention. This chip 17 is attached to a hole portion 20 shown in FIG. 12. Pads 27 for the same signals $S_1$ to $S_7$ are arranged on left-hand and right-hand sides of the chip interior and are connected to each other through a wiring material 21 within the chip 17 with relatively low impedance. Such a structure constitutes the features of the present invention greatly different from the general tape carrier package for a liquid crystal driver IC. For example, the wiring material 21 is formed by a conductive material such as a second layer metal on the chip, a gold bumping material formed on the chip in a pad portion of the tape carrier package, etc. Pads 28 for output signals 23 for operating a liquid crystal are formed in an upper portion of the chip 17. No pads are basically arranged in a lower portion of the chip 17. However, dummy pads may be arranged to secure a connecting strength of the chip and the tape carrier package.

Figure 15:
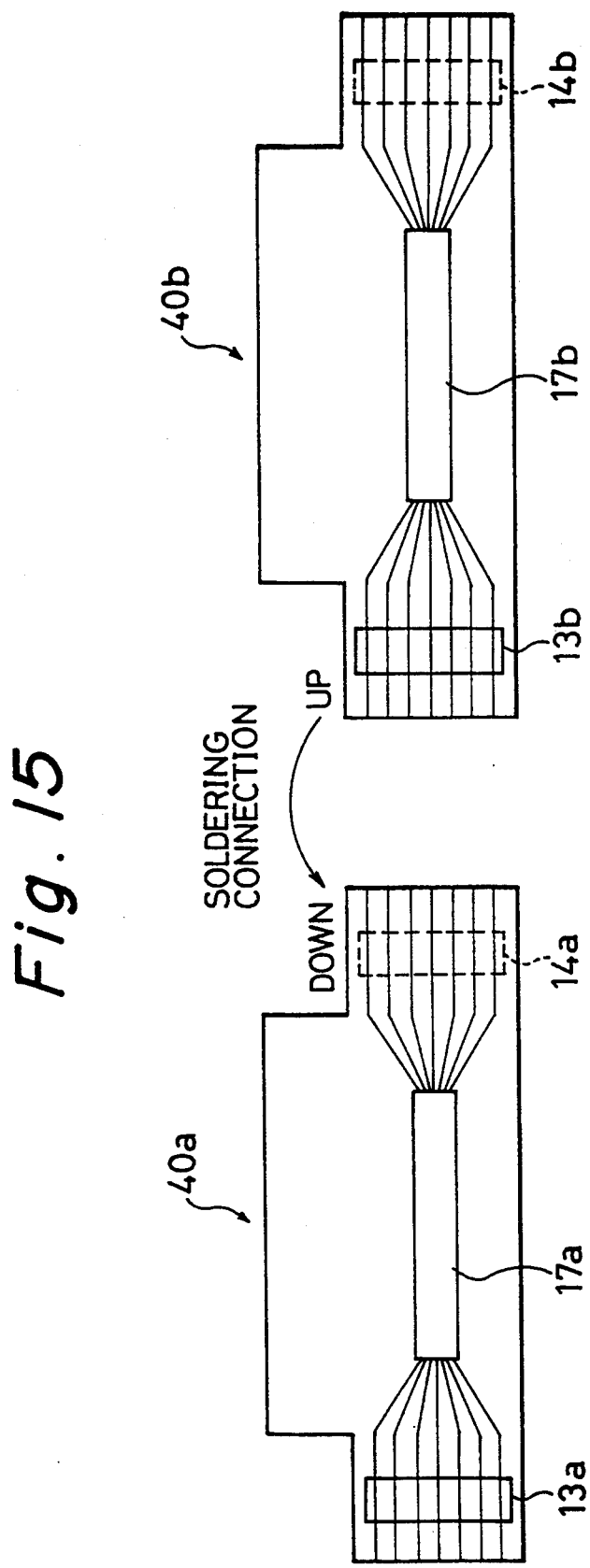
FIG. 15 is a view showing a connecting form between tape carrier packages for a liquid crystal driver integrated circuit each shown in FIG. 12.

FIG. 15 shows a concrete connecting procedure of driver integrated circuits in the present invention. An external connecting terminal on the side of a slit 13b of the tape carrier package is arranged upward. An external connecting terminal on the side of a connecting lead 14a of an adjacent integrated circuit is arranged downward. These external connecting terminals are then positioned, soldered and connected to each other by overlapping both leads of the external connecting terminals.

Figure 14:
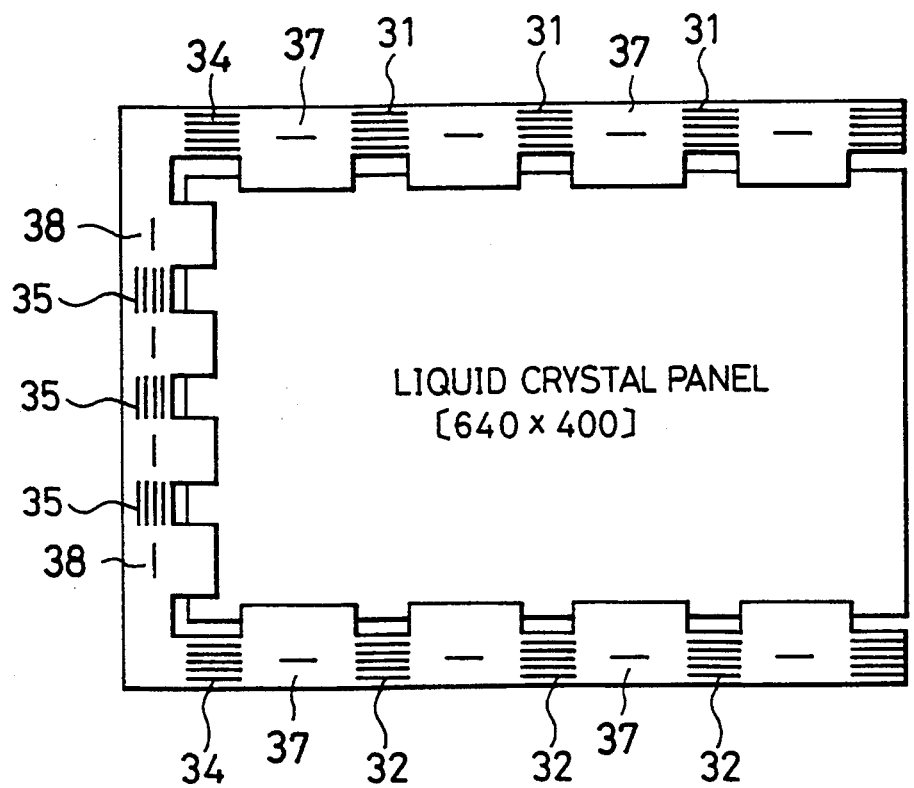
FIG. 14 is a view showing one example of the construction of a liquid crystal module using the tape carrier package for a liquid crystal driver integrated circuit shown in FIG. 12.

FIG. 14 shows one example of the connection of a liquid crystal panel and a tape carrier package as an example of the formation of a liquid crystal module. For example, similar to the general liquid crystal module shown in FIG. 7, the liquid crystal panel has 640×400 dots in transversal and longitudinal directions thereof, respectively. The liquid crystal panel uses eight segment drivers 37 on upper and lower sides of the panel. The eight segment drivers 37 are constructed by using printed wired boards (PWBs) in the present invention and are composed of four segment drivers 37 on the upper side of the panel and four segment drivers 37 on the lower side of the panel. The liquid crystal panel also uses four common drivers 88 on a left-hand side thereof. In this case, the number of outputs is set to 160 with respect to each of the segment drivers 37 and is set to 100 with respect to each of the common drivers 38.

Adjacent devices of the eight segment drivers 37 and the four common drivers 38 are soldered and connected to each other through connecting leads formed in TCP portions 31, 32, 35 in which the adjacent devices overlap each other. Namely, the adjacent devices are connected to each other in six portions on a segment driver side composed of three portions 31 on the upper side of the panel and three portions 32 on the lower side of the panel. The adjacent devices are also connected to each other in three portions 35 on a common driver side. The segment and common drivers 37, 38 can be connected to each other by the same connecting system. In this case, the segment and common drivers are connected to each other in two portions 34.

As mentioned above, in accordance with the present invention, the shape of a tape carrier package for a driver integrated circuit can be reduced. Concretely, a longitudinal size H1 of the tape carrier package in the above embodiment shown in FIG. 12 is equal to or smaller than 6 mm although the longitudinal size H5 of the general tape carrier package shown in FIG. 5 is set to be equal to or greater than 15 min.

As mentioned above, this embodiment relates to the structure or shape of a tape carrier package for connecting driver integrated circuits of a liquid crystal display unit to each other. The tape carrier package has a T-shape and has the IC chip 17 in a central portion thereof. The tape carrier package has the terminal portions 11 and 12 for input and output signals symmetrically arranged on the left-hand and right-hand sides thereof. The tape carrier package also has an output terminal portion 15 for operating a liquid crystal in the central portion of the tape carrier package. The left-hand and right-hand input terminals 11 and 12 for input and output signals are connected to each other through an internal circuit of the driver IC chip 17 with low impedance. The terminal portion 11 has the slit portion 13 removing a TCP material therefrom. In accordance with such a structure, a terminal portion for input and output signals of a first electric circuit can be electrically connected to that of a second electric circuit. Thus, the input and output signals can be continuously transmitted without using any connecting line of a connecting substrate, etc.

As mentioned above, it is not necessary to dispose a substrate for parallel connection in the tape carrier package for a liquid crystal driver integrated circuit in the present invention. Further, a liquid crystal module using the tape carrier package of the present invention can be made compact and light in weight. Thus, cost of the liquid crystal module can be reduced.

Many widely different embodiments of the present invention may be constructed without departing from the spirit and scope of the present invention. It should be understood that the present invention is not limited to the specific embodiments described in the specification, except as defined in the appended claims.

What is claimed is:

1. A tape carrier package apparatus for a liquid crystal driver integrated circuit, comprising:

a pair of tape carrier packages for a liquid crystal driver integrated circuit;

a plurality of input external connecting terminals disposed on respective one ends of said tape carrier packages;

a plurality of output external connecting terminals disposed on the respective other ends of said tape carrier packages, opposite the input external connecting terminals; and a plurality of connecting means for connecting said input external connecting terminals to said output external connecting terminals, respectively, at least one of the pair of tape carrier packages including only a single slit wherein said output external connecting terminals of at least one of said pair of tape carrier packages are connected to said input external connecting terminals of the other of said pair of tape carrier packages, respectively.

2. A tape carrier package apparatus as claimed in claim 1, wherein each of said output external connecting terminals of said one tape carrier package is connected directly to said input external connecting terminals of said other tape carrier package by soldering.

3. A tape carrier package apparatus as claimed in claim 1, wherein said connecting means is disposed in said liquid crystal driver integrated circuit.

4. A tape carrier package apparatus as claimed in claim 3, wherein said connecting means comprises pads located in said liquid crystal driver integrated circuit and a wiring material within said liquid crystal driver integrated circuit.

5. A liquid crystal panel module comprising:

a liquid crystal panel;

a plurality of tape carrier package units arranged along a periphery of the liquid crystal panel, each of the plurality of tape carrier package units including, a pair of tape carrier packages for a liquid crystal driver integrated circuit, a plurality of input external connecting terminals disposed on respective one ends of said tape carrier packages, a plurality of output external connecting terminals disposed on the respective other ends of said tape carrier packages, opposite the input external connecting terminals and a plurality of connecting means for connecting said input external connecting terminals to said output external connecting terminals, respectively, at least one of the pair of tape carrier packages including only a single slit wherein said output external connecting terminals of one of said pair of tape carrier packages are connected to said input external connecting terminals of the other of said pair of tape carrier packages, respectively.

* * * * *